US00RE38097E

(19) United States
(12) Reissued Patent
Trussell et al.

(10) Patent Number: US RE38,097 E
(45) Date of Reissued Patent: Apr. 29, 2003

(54) CHEMICAL VAPOR DEPOSITION SYSTEM WITH A PLASMA CHAMBER HAVING SEPARATE PROCESS GAS AND CLEANING GAS INJECTION PORTS

(75) Inventors: David Trussell, Fremont, CA (US); C. Robert Koemtzopoulos, Hayward, CA (US); Felix Kozakevich, Sunnyvale, CA (US)

(73) Assignee: Lam Research Corporation, Fremont, CA (US)

(21) Appl. No.: 09/989,106

(22) Filed: Nov. 21, 2001

Related U.S. Patent Documents

Reissue of:
(64) Patent No.: 5,988,187
Issued: Nov. 23, 1999
Appl. No.: 08/679,356
Filed: Jul. 9, 1996

(51) Int. Cl.[7] ..... B08B 9/100; A45B 25/12; A45B 25/00; A45B 25/14

(52) U.S. Cl. ..... 134/22.1; 134/1.1; 134/37; 134/22.18; 134/31

(58) Field of Search ..... 134/22.1, 1.1, 134/37, 22.18, 31

(56) References Cited

U.S. PATENT DOCUMENTS 4,786,352 A 11/1988 Benzing ..... 156/345.48
5,207,836 A 5/1993 Chang ..... 134/1
5,211,825 A 5/1993 Saito et al. ..... 204/192.32
5,449,411 A 9/1995 Fukuda et al. ..... 118/723 MP

FOREIGN PATENT DOCUMENTS

EP 0354853 A 2/1990

*Primary Examiner*—Ali R. Salimi
(74) *Attorney, Agent, or Firm*—Lowe Hauptman Gilman & Berner, LLP

(57) ABSTRACT

A method and arrangement for the insitu cleaning of a chamber in which process gas is injected into the chamber through gas injection ports. Separate gas injection ports through which process gas and the cleaning gas are injected into the chamber are provided. The process gas is injected into the chamber, such as a plasma chamber, through a first gas injection port while the cleaning gas, which cleans the residue left by the process gas during the deposition process, is injected into the chamber through the second gas injection port that is separate from the first gas injection port through which the process gas is injected. The separation of the gas injection ports provides an equalized pressure within the jet screw ports for the process gas and the interior of the chamber. This allows the jet screw ports to be maximally cleaned and reduces the frequency of replacement of the jet screw ports in the chamber.

17 Claims, 4 Drawing Sheets

CHEMICAL VAPOR DEPOSITION SYSTEM WITH A PLASMA CHAMBER HAVING SEPARATE PROCESS GAS AND CLEANING GAS INJECTION PORTS

Matter enclosed in heavy brackets [ ] appears in the original patent but forms no part of this reissue specification; matter printed in italics indicates the additions made by reissue.

FIELD OF THE INVENTION

The present invention relates to the field of chemical vapor deposition systems, and more particularly, to apparatus and methods for cleaning the residue left by the process gas which has been injected into a plasma chamber of the system.

BACKGROUND OF THE INVENTION

Chemical vapor deposition (CVD) systems normally employ a chamber in which gaseous chemicals react. From these reactions, a substance is deposited on a wafer surface to form dielectric, conductor, and semiconductor film layers that constitute an integrated circuit, for example. In a chemical vapor deposition system, a process gas is injected into the plasma chamber in which a plasma is formed. Due to the ion bombardment within the plasma of the process gas, ($SiH_4$(silane), for example) silicon will be deposited on a wafer which has been previously placed in the chamber. During this deposition step, the gas injection ports, also known as jet screws, typically clog with silicon-rich oxide residue formed by the combined $SiH_4$ (the process gas) and oxygen radicals flowing to the gas injection port. These oxygen radicals originate from the plasma chamber.

The residue coats the walls of the chamber, and also tends to clog the gas injection ports. The chamber, as well as the gas injection ports, needs to be cleaned periodically. This ensures that each wafer encounters the same environment so that the deposition process is repeatable. Since opening up the chamber (changing out the hardware) for cleaning is very labor intensive and costly, a method for removing the deposition from the chamber walls without opening the chamber itself has been previously developed. This "insitu" cleaning has been accomplished in the past using fluorine. The fluorine is injected into the chamber as $NF_3$. Fluorine is known to etch silicon and silicon dioxide at high rates when it is accompanied by ion bombardment. Radio frequency (RF) power provides the energy for ion bombardment, with the $NF_3$ serving as the source of fluorine.

Typically, after a wafer is processed through deposition in the CVD system, the wafer is removed to a load lock. A cover wafer is then transferred to the chamber and placed on the chuck. The cover wafer is a standard silicon wafer that is coated with aluminum. It protects the chuck surface from the plasma cleaning and conditioning steps that follow.

The RF power is applied to the chamber and $NF_3$ is injected into the chamber. The walls will then be cleaned of oxide deposition. However, there may still be a significant amount of fluorine in the chamber and on the walls and free particles. For this reason, a pre-deposition conditioning step is often required. The conditioning step is essentially a deposition that getters the fluorine and tacks down particles onto the chamber walls. When this pre-deposition conditioning step is completed, the cover wafer is transported back to its cassette and the next wafer can then be processed.

In conventional systems for routing the gas to the chamber, injection ports are shared between the deposition process gas ($SiH_4$) and the insitu cleaning gas (NF3). Such an arrangement is shown in prior art FIG. 1 in which a portion of a process chamber is schematically depicted. The plasma chamber 10 injects oxygen at port 12 into the interior 14 of the plasma chamber. The oxygen radicals are formed within the plasma chamber 14. The shared injection ports for the deposition process gas and the insitu clean gas are depicted as reference numeral 16. During the deposition step, the gas injection ports (also known as "jet screws") clog with silicon-rich oxide residue formed by the combined $SiH_4$ and the incoming oxygen radicals originating from the plasma chamber.

As stated earlier, the insitu cleaning gas is designed to chemically etch the $SiO_2$ (silicon dioxide) residue. However, high pressure caused by supersonic gas flows in front of the jet screws causes regions of scarce fluorine radicals that reduce fluorine induced etching of the $SiO_2$. FIG. 2 a schematic depiction of a detail of a jet screw. $NF_3$ gas is injected into the chamber 14 through the jet screw 16. Within the jet screw, there is $SiO_2$ clogging, schematically depicted at point 18 at the jet screw 16. The high pressure region 20 of scarce fluorine radicals caused by the supersonic gas flows in front of the jet screws 16 reduces the fluorine induced etching of the $SiO_2$ in this area, and in particular, prevents the jet screws 16 from being unclogged of the $SiO_2$ residue. All of the other chamber surfaces are typically cleaned except for the jet screw ports.

Due to the $SiO_2$ clogging of the jet screw ports, the jet screws are normally replaced after approximately 300 wafers have been processed. This process involves shutting down the chamber at high expense and loss of productivity. Another problem of the prior art arrangement is that the $SiH_4$ and $NF_3$ gases, if combined, are highly combustible so that routing the gases through the same injection ports can be relatively dangerous.

SUMMARY OF THE INVENTION

There is a need for a gas routing system and method for routing gas in a plasma chamber so as to unclog the jet screws through which deposition gas is injected into the chamber.

These and other needs are met by the present invention which provides an arrangement for insitu cleaning of a chamber in which process gas is injected into the chamber through gas injection ports. The arrangement comprises a chamber in which a process is performed, and at least a first gas injection port in the chamber through which the process gas is injectable into the chamber. At least a second gas injection port is provided in the chamber through which insitu cleaning gas is injectable into the chamber. The cleaning gas injected into the chamber also contacts the first gas injection port to clean the first gas injection port. The first and second gas injection ports are separate ports.

By re-routing of the cleaning gas through a separate, second gas injection port, the pressures within the jet screws are equalized with the pressure of the chamber. This allows higher fluorine dissociation and $SiO_2$ etching.

Another advantage of the present invention is the injection of the $SiH_4$ and NF3 gases through completely separate manifolds, thus providing a clear safety advantage.

A further advantage of the present invention is the reduction in the amount of maintenance required of the chamber. For example, using the gas routing system of the present invention, the chamber does not need to be maintained for approximately 3,000 wafers. This is a decided advantage over the prior art in which the jet screws needed to be replaced after only 300 wafers.

Another advantage of the present invention is that the insitu clean time is decreased due to more efficient cleaning of the jet screws. This provides a throughput advantage of, for example, two wafers per hour. Finally, another advantage is that plasma to surface arcing is completely eliminated in the jet screw area.

Another embodiment of the present invention satisfies the earlier stated needs by providing a method of routing gas to a plasma chamber comprising the steps of: injecting process gas into the plasma chamber through a first gas injection port, and injecting chamber gas into the plasma chamber through a second gas injection port. The second gas injection port is separate from the first gas injection port. The cleaning gas cleans the plasma chamber and the first gas injection port.

Another method of the present invention provides for unclogging jet screw ports in the chamber. The jet screw ports inject process gas into the chamber. This method comprises the steps of terminating injection of the process gas into the chamber and injecting cleaning gas into the chamber through openings separate from the jet screw ports to equalize pressure of the cleaning gas within the jet screw ports with pressure of the cleaning gas within the chamber.

In another embodiment of the present invention, an electron cyclotron resonance chemical vapor deposition system is provided. This system includes an electron cyclotron resonance plasma chamber, and a gas supply that supplies plasma forming gas, process gas, and cleaning gas to the plasma chamber. The plasma chamber has a first port through which the process gas is supplied, and a second port, separate from the first port, through which the cleaning gas is supplied.

The foregoing and other features, aspects and advantages of the present invention will become more apparent from the following detailed description of the present invention when taken in conjunction with the accompanying drawings.

DETAILED DESCRIPTION OF THE DRAWINGS

Figure 1:
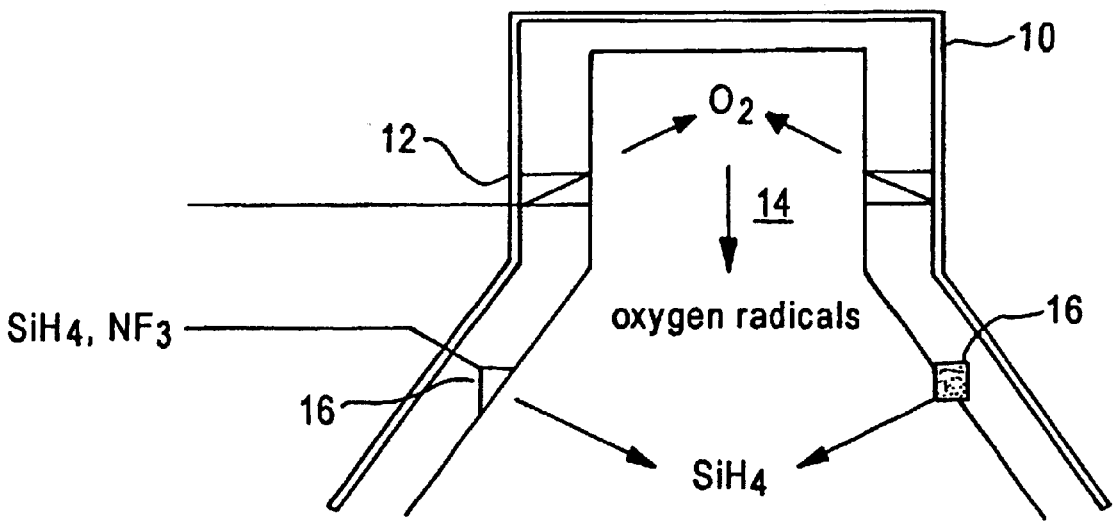
Figure 1 PRIOR ART
FIG. 1, as described supra, is a schematic depiction of a portion of a process chamber in accordance with the prior art.
Figure 2:
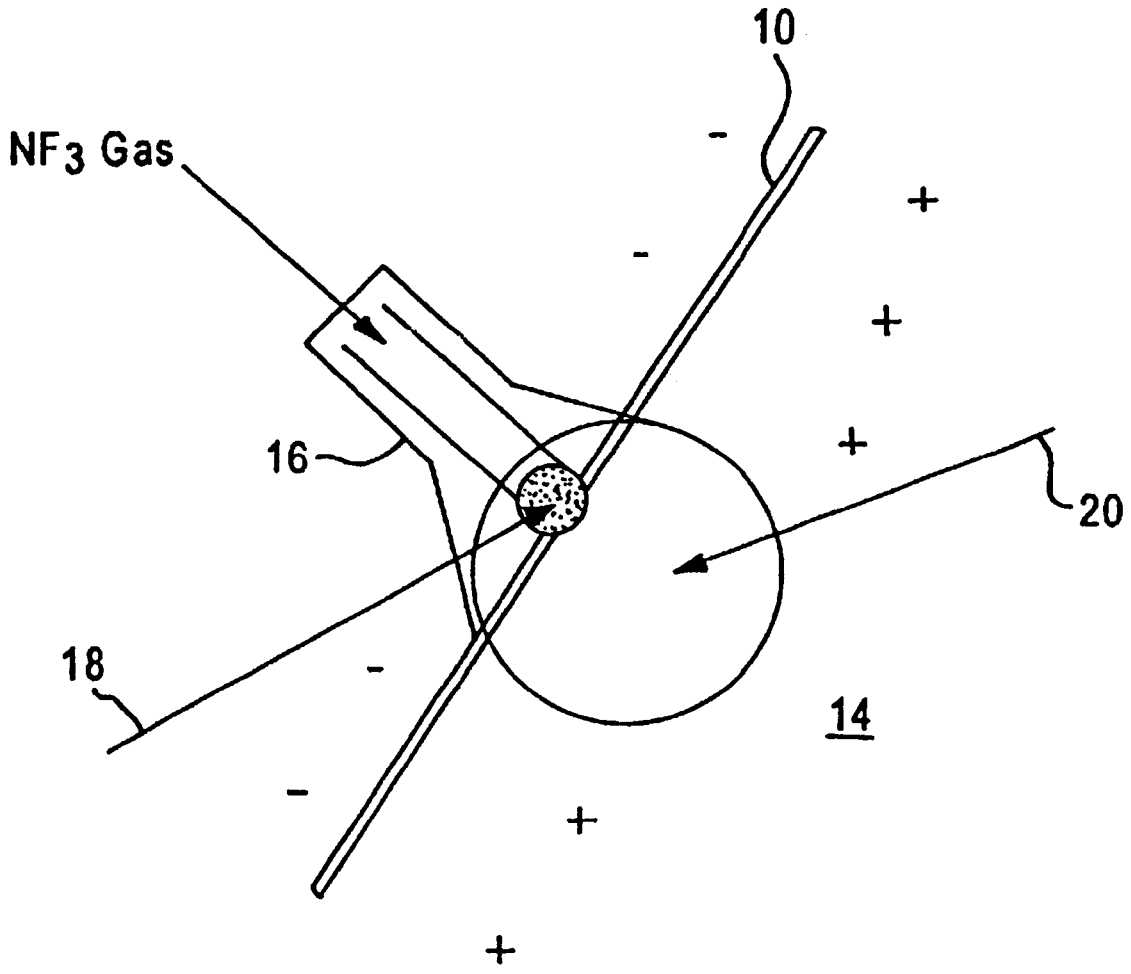
Figure 2 PRIOR ART
FIG. 2, as described supra, is a schematic depiction of a detail of a portion of the process chamber.
Figure 3:
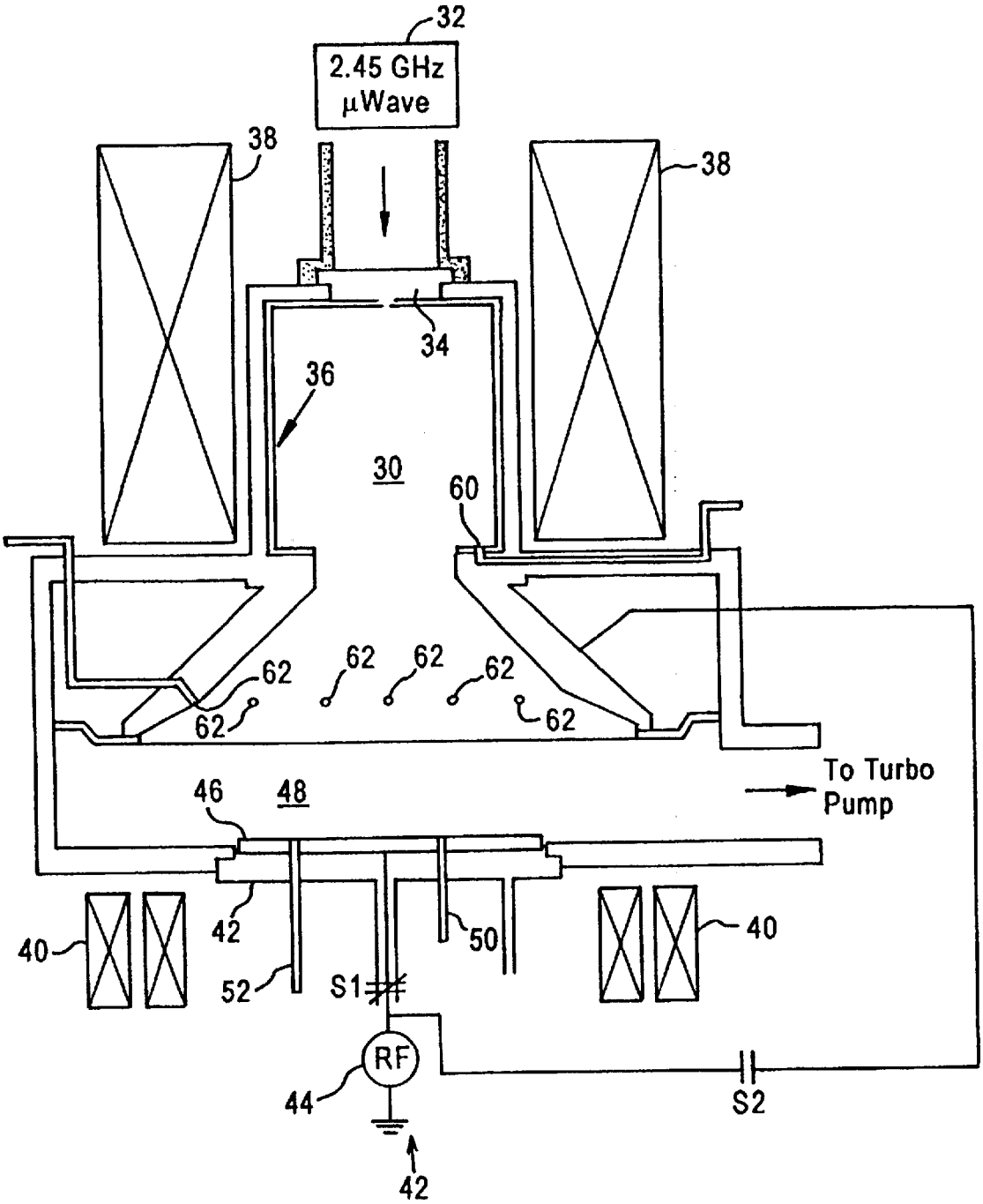
FIG. 3 is a schematic cross-sectional diagram of an electron cyclotron resonance chemical vapor deposition system constructed in accordance with an embodiment of the present invention.

A schematic depiction of a cross-section of an electron cyclotron resonance (ECR) chemical vapor deposition (CVD) system constructed in accordance with an embodiment of the present invention is provided in FIG. 3. The system includes an electron cyclotron resonance plasma chamber 30 having a 2.45 GHz microwave power supply 32. The microwaves pass through a microwave window 34 into the plasma chamber 30. A quartz liner 36 lines the interior of the plasma chamber 30.

Plasmas are generated by the ionization of gas molecules. This may be accomplished by an energetic electron striking a neutral molecule. Electrons can also cause dissociation and other excitations. The electrons are excited by electric fields such as RF and microwaves. As such, these are the conventional methods for generating processing plasmas.

In contrast to conventional plasmas that typically operate at pressures greater than 70 millitorr, high density plasmas generally operate at pressures in the range of 0.5 to 10 millitorr. The ion to neutral ratio can be as high as one in a hundred (compared to less than one in a million in low density plasmas). Ion densities can be more than 1E12 per cubic centimeter. Such plasmas require sophisticated plasma generation techniques such as electron cyclotron resonance.

In an electron cyclotron resonance plasma chamber, the electron angular frequency due to the magnetic field matches a microwave frequency, so that electron cyclotron resonance occurs. In this state, electrons gain energy from the microwave source and accelerate in a circular motion. The cross-section for ionization is therefore effectively increased, allowing for the creation of high density plasma at low pressure.

The magnetic field is also used to extract the ions out of the plasma source. The ions follow the lines of induction toward the wafer. The plasma tends to be cone-shaped due to the divergent magnetic field. The divergent magnetic field creates a force that pulls the electrons out of the plasma chamber. The resulting potential extracts ions to form a varied directional plasma stream.

The divergent magnetic field is created by a primary coil 38 that supplies the 875 Gauss that is needed for the electron cyclotron resonance condition. This primary coil 38 also provides the divergent magnetic field for ion extraction.

Auxiliary magnetic coils 40 are provided behind a wafer holder assembly 42 to shape the plasma into the desired shape. The wafer holder assembly 42 holds a wafer (not illustrated in FIG. 3). The wafer holder 42 includes a 13.56 MHz RF power supply (up to 2500 W). The RF power supply provides, along with the microwaves, the electric fields that excite the electrons to generate the processing plasma.

An electrostatic chuck is provided to hold the wafers within a reactor chamber 48. The use of an electrostatic chuck obviates the need for mechanical clamping of the wafer. Wafer cooling is provided by helium, for example, to the underneath or backside of the wafer through a helium supply line 50. Closed-loop control of the helium pressure regulates the wafer temperature during deposition. Insitu wafer temperature monitoring is provided through a temperature probe 52 which sends its sensor signals to a controller (not depicted). A 3,000 1/sec turbomolecular pump with a base pressure less than $1\times10^{-6}$ Torr is used to control the pressure within the plasma chamber 30 and the reactor chamber 48.

A wafer transport mechanism (not depicted) is provided for transporting wafers into and out of the reactor chamber 48. A conventional wafer transport system may be used for this purpose.

In certain embodiments of the present invention, oxygen and argon are provided into the plasma chamber 30 from a gas supply through an injection port 60. Plasma will be generated in the plasma chamber upon application of the RF energy and microwave energy by the RF generator 44 and the microwave generator 32.

Once a wafer base has been transported into the reactor chamber 48 by the wafer transport system and placed onto the electrostatic chuck 46, and a plasma has been generated within the plasma chamber 30, the deposition gas ($SiH_4$, for example,) is introduced into the plasma chamber 30 through one or more gas injection ports 62 that are separate from the gas injection port through which the gas to form the plasma is provided. The gas injection ports 62 are jet screws, for example. During deposition, these jet screws, along with the remaining surfaces of the plasma chamber 30 and the reactor chamber 48, become coated with a residue ($SiO_2$). This residue should be cleaned from the surfaces of the chamber and the interior of the jet screws 62 between the processing of each wafer, so that each wafer will encounter the same environment, thereby making the process repeatable. Accordingly, the cleaning gas ($NF_3$, in the exemplary embodiment of the present invention) is introduced into the plasma chamber and RF power is applied from the RF generator 44 to the plasma chamber 30.

As discussed earlier, in the prior art arrangement, the jet screw ports 62 become clogged with the $SiO_2$ residue, and injection of the $NF_3$ cleaning gas through the jet ports 62 produced a high pressure region in the plasma chamber 30 directly in front of the jet screw during the insitu cleaning step. This caused a poor fluorine dissociation due to the high localized pressure in front of the jet screw ports 62. As a consequence, there was not a sufficient amount of fluorine radicals to react with the $SiO_2$ to clean the jet screw ports 62 sufficiently. Since the jet screw ports 62 were not being cleaned sufficiently during insitu cleaning, their frequent replacement, for example after approximately 300 wafers, was required.

Figure 4:
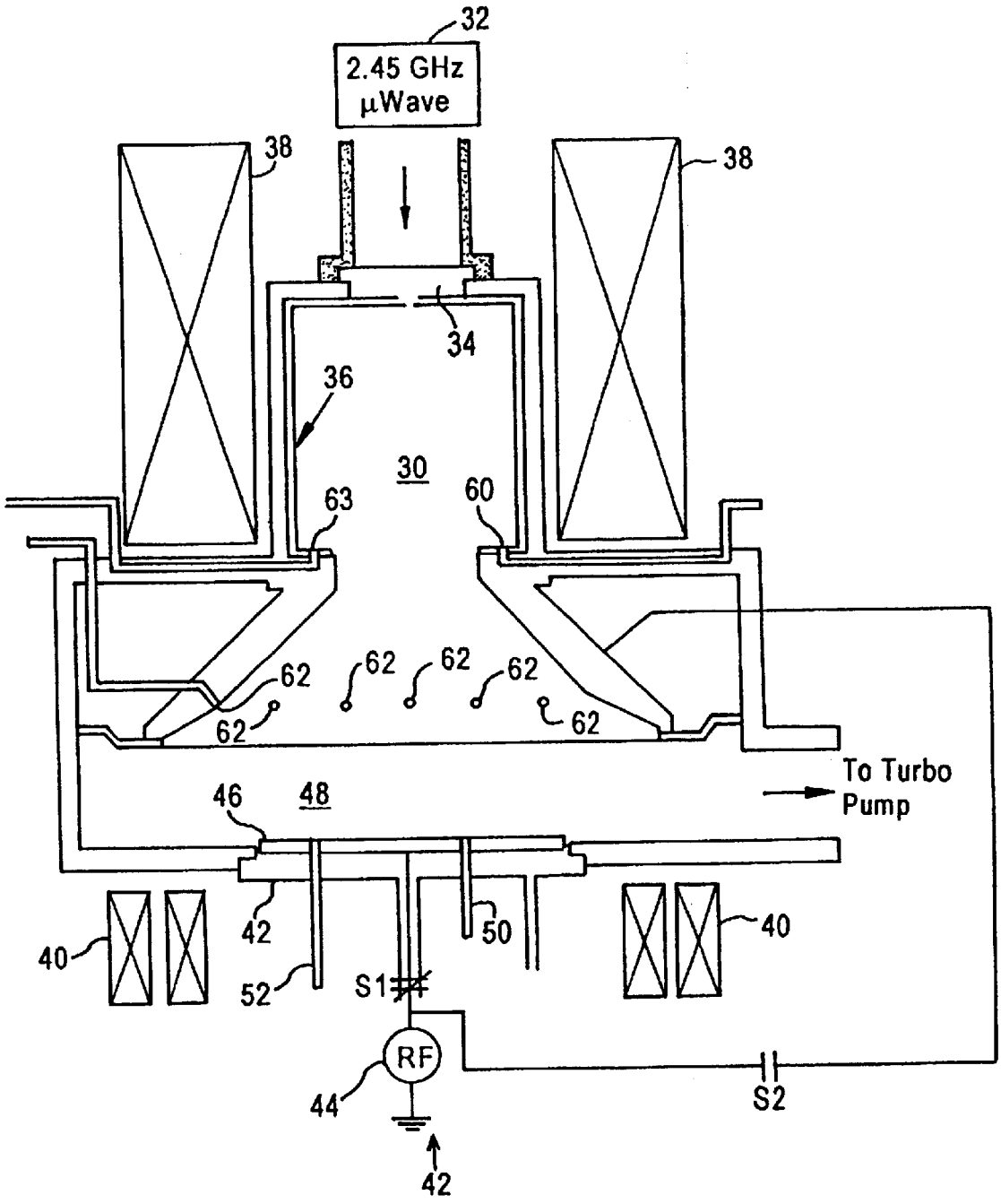
FIG. 4 is a schematic cross-sectional diagram of a chemical vapor deposition system constructed in accordance with another embodiment of the present invention.

In the present invention, as depicted in FIG. 3, the $NF_3$ cleaning gas is injected into the plasma chamber 30 through injection port 60, the same port through which the oxygen and argon gas is injected. This injection port 60 is separate from the injection ports (jet screw ports) 62 through which the deposition gas is injected. In other embodiments of the invention, the cleaning gas is injected in a dedicated port, exclusively devoted to cleaning gas injection. Such an embodiment is depicted in FIG. 4, in which the cleaning gas is injected through its own dedicated port 63, the oxygen and argon gas being injected through injection port 60, and the $SiO_2$ being injected through the jet screw ports 62.

The routing of the cleaning gas to be injected into the plasma chamber 30 through a port separate from the injection port through which the deposition gas is injected has a number of advantages, including the equalization of pressure within the jet screw 62 and the plasma chamber 30 during insitu cleaning. This prevents the high pressure region in the plasma chamber 30 and jet screw 62 from forming. As a consequence, there is no longer a poor fluorine disassociation due to the high localized pressure in front of the jet screws 62. The jet screws 62 will therefore be cleaned to relatively the same extent as the other surfaces of the plasma chamber 30.

Another advantage provided by the separate routing of the cleaning gas and the deposition gas is related to safety. As stated earlier, the $SiH_4$ and $NF_3$ gases are highly combustible if combined. Their separation according to the present invention provides a clear safety advantage. Also, all plasma to surface arcing is eliminated in the area of the jet screw ports 62. Further, the superior cleaning performance within the jet screw 62 eliminates the need for replacing the jet screws after only 300 wafers. The inventors have found that no maintenance is required in the plasma chamber 30 for approximately 3,000 wafers. This is an extremely significant advantage in reducing the amount of downtime for maintenance of the chamber. Related to this, the insitu clean time is also decreased due to a more efficient cleaning of the jet screw ports 62. For example, a throughput advantage of approximately at least 2 wafers per hour may be realized using the gas routing system of the present invention. Where the processing of a single wafer provides high profits, the throughput of the wafers is critical.

An exemplary embodiment of the operation of the invention is as follows. After the deposition process has been completed, and the deposition gas is no longer being supplied to the plasma chamber 30, the wafer being processed is removed by the wafer transport system to the load lock. At this point, a cover wafer is transferred to the reactor chamber 48 and placed on the electrostatic chuck 46. The cover wafer is a standard silicon wafer that is coated with aluminum. The purpose of the cover wafer is to protect the chuck surface from the plasma cleaning and conditioning step.

Once the cover wafer is in place, the RF power is applied to the plasma chamber 30 and the $NF_3$ cleaning gas is injected in the plasma chamber 30 through port 60. After the walls of the chamber 30 and the jet screw port 62 have been cleaned of oxide deposition, there is still a fair amount of fluorine in the chamber 30 and on the walls, as well as free particles. For this reason, a pre-deposition conditioning step may be used. The conditioning step is essentially a deposition that getters the fluorine and tacks down particles. When this pre-deposition conditioning step is completed, the cover wafer is then transported back to its cassette and the next wafer can then be processed.

Although the present invention has been described with an electron cyclotron resonance chemical vapor deposition system, the invention also finds use in other types of systems employing a plasma chamber in which a deposition gas is injected, leaving a residue that must be cleaned by an insitu cleaning gas. Also, although an exemplary embodiment has been described with specific gases for the deposition gas, the oxygen and argon forming gases, and the cleaning gas, the invention is not limited to such gases, and may be used with other types of gases without departing from the spirit or scope of the present invention.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of unclogging a first port in a vacuum chamber for processing workpieces, the first port injecting gas into the chamber, the method comprising the steps of:

terminating injection of the process gas into the chamber, then, while injection of the process gas into the chamber is terminated and the chamber remains in vacuo and the port is clogged, *applying r.f. plasma excitation power to a structure including the first port while* injecting cleaning gas into the chamber through a second opening separate from the first port to equalize pressure of the cleaning gas within the first port with pressure of the cleaning gas within the chamber[.], *the cleaning gas being converted to a plasma by r.f. plasma excitation power applied to it via the structure.*

[2. The method of claim 1, further comprising supplying energy into the chamber in the presence of the cleaning gas to generate ion bombardment, with the cleaning gas providing a cleaning agent that etches depositions in the chamber and the first port when the ion bombardment is generated.]

3. The method of claim [2] *1*, wherein the chamber has a chuck onto which wafers are placed, the method further comprising placing a cover wafer on the chuck prior to injecting the cleaning gas.

4. The method of claim 3, further comprising performing a deposition after the cleaning agent etches the deposits to getter the cleaning agent, followed by removing the cover wafer from the chamber.

5. The method of claim 1 wherein the first port comprises a jet screw port.

6. A method of processing workpieces in a vacuum plasma processing chamber and cleaning the chamber while the workpieces are not being processed comprising processing the workpieces in the chamber while the chamber is in vacuo by introducing a processing gas into the chamber through a first port and applying electric energy to the processing gas to establish a plasma that processes the workpiece, the processing gas having a tendency to form a residue that clogs the first port, the first port while clogged and while gas is applied to it establishing a high pressure region which resists the flow of gas through the first port into the chamber, and while the workpieces are not being processed and the chamber remains in vacuo, *applying, r.f. plasma excitation power to a structure including the first port while* applying a cleaning gas to the chamber through a second port separate from the first port in such a manner that pressure is equalized at the first port and the cleaning gas unclogs the first port of the residue and cleans the remainder of the chamber.

7. The method of claim 6 further comprising introducing a second processing gas into the chamber through the second port during vacuum plasma processing of the workpieces, the second processing gas being of a type that (a) does not have a tendency to form a residue in the second port and (b) reacts chemically with the first reaction gas.

8. The method of claim 7 wherein the second processing gas includes argon and oxygen.

9. The method of claim 8 wherein the first processing gas includes $SiH_4$ and the residue comprises $SiO_2$.

10. The method of claim 6 wherein gas is not introduced into the chamber through the second port during workpiece processing and further comprising introducing another reaction gas into the chamber via a third port during workpiece processing, the reaction gases introduced into the chamber via the first and third ports chemically reacting during workpiece processing.

11. The method of claim 6 wherein no gas flows through the first port while the cleaning gas is applied to the chamber through the second port.

12. The method of claim 6 wherein the first port comprises a jack screw.

13. The method of claim 6 wherein the chamber includes a workpiece holder, and covering the workpiece holder while the cleaning gas is applied to the chamber via the cleaning port.

14. The method of claim 6 wherein the cleaning gas is $NF_3$.

15. The method of claim 6 further including applying electric energy to the cleaning gas to establish a plasma that cleans the first port of the residue and the chamber.

16. The method of claim 6 further comprising applying a getter to the chamber after the cleaning gas has been applied and before workpiece processing begins, the getter removing residual atoms of the cleaning gas from the chamber.

17. A method of cleaning a vacuum processing chamber between workpiece processing operations wherein the workpiece processing is performed by supplying processing gas to the chamber via a first port while the chamber is in vacuo, the processing gas having a tendency to leave a clogging residue in the first port, the chamber including a second port separate from the first port, the method comprising *applying r.f. plasma excitation power to a structure including the first port while* introducing a cleaning gas into the chamber via the second port while the chamber remains in vacuo and the processing gas is not supplied to the chamber so pressure is equalized at the first port and the cleaning gas cleans the first port of the clogging residue as well as the remainder of the chamber[.], *the cleaning gas being converted to a plasma by r.f. plasma excitation power applied to it via the structure.*

18. The method of claim 17 wherein the cleaning gas is $NF_3$.

[19. The method of claim 18 further including applying electric energy to the cleaning gas to establish a plasma that cleans the first port of the residue and the chamber.]

[20. The method of claim 17 further including applying electric energy to the cleaning gas to establish a plasma that cleans the first port of the residue and the chamber.]

* * * * *